United States Patent [19]
Chun

[11] Patent Number: 6,043,430
[45] Date of Patent: *Mar. 28, 2000

[54] BOTTOM LEAD SEMICONDUCTOR CHIP PACKAGE

[75] Inventor: Heung-Sup Chun, Choongcheongbuk-Do, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/023,287

[22] Filed: Feb. 13, 1998

[30] Foreign Application Priority Data

Mar. 14, 1997 [KR] Rep. of Korea ............... 97-8654

[51] Int. Cl.⁷ ............................................ H01L 23/02

[52] U.S. Cl. .................. 174/52.4; 257/672; 257/673; 257/686; 257/693

[58] Field of Search ...................... 257/672, 686, 257/693, 735, 685, 777, 673; 174/52.2, 52.4

[56] References Cited

U.S. PATENT DOCUMENTS

| | | | |
|---|---|---|---|
| 5,363,279 | 11/1994 | Cha | 361/767 |
| 5,583,375 | 12/1996 | Tsubosaki et al. | 257/692 |
| 5,744,827 | 4/1998 | Jeong et al. | 257/686 |
| 5,770,888 | 6/1998 | Song et al. | 257/696 |
| 5,801,439 | 9/1998 | Fujisawa et al. | 257/686 |
| 5,804,874 | 9/1998 | An et al. | 257/676 |

*Primary Examiner*—Kristine Kincaid
*Assistant Examiner*—Hung V Ngo
*Attorney, Agent, or Firm*—Fleshner & Kim

[57] ABSTRACT

A bottom lead package is capable of increasing a memory capacity for a mounting position on a mother board by stacking several semiconductor packages such that exposed surfaces of leads on upper and lower surfaces of the package are aligned. The package includes a semiconductor chip, a plurality of lower leads attached to the lower side of the chip by an adhesive, a plurality of upper leads attached to the upper side of the chip by an adhesive and to the upper surfaces of the lower leads, wherein metal wires electrically connect the upper leads with a plurality of chip pads formed on the chip, and wherein a molding section packages the chip, the metal wires and the upper and lower leads, such that the upper and lower surfaces of the upper and lower leads, respectively, are externally exposed.

13 Claims, 5 Drawing Sheets

BOTTOM LEAD SEMICONDUCTOR CHIP PACKAGE

BACKGROUND OF THE INVENTION

1. Field of the Invention

The present invention relates to a bottom lead package for a semiconductor chip, and in particular to a stackable type bottom lead package.

2. Background of the Related Art

Bottom lead packages, which are a type of semiconductor chip package, are increasingly used in the industry. Such bottom lead packages are classified into two types based on a chip pad formation position. One type is a Side Pad-Bottom Lead Package (S-BLP) in which chip pads are disposed on an upper edge portion of the chip. The other type is a Center Pad-Bottom Lead Package (C-BLP) in which chip pads are disposed on an upper center portion of the chip.

The related art bottom lead packages will now be explained in more detail with reference to FIGS. 1–4.

FIG. 1 illustrates an S-BLP. As shown therein, the S-BLP includes a semiconductor chip 1, and a plurality of upwardly bent leads 3 which are attached to the lower sides of the chip 1 by an adhesive 2. Metal wires 4 electrically connect a plurality of chip pads 1a formed on the sides of the upper surface of the chip 1 to the leads 3, and a molding section 5 encapsulates the chip 1, the metal wires 4, and the leads 3 with an epoxy such that lower surfaces of the leads 3 are externally exposed.

To mount an S-BLP 6 on a printed circuit board (PCB), a solder mask is disposed on the upper surface of a printed circuit board (PCB) 7, and a solder paste 8 is screen-printed on the upper surface thereof. The solder paste 8 is applied to the upper surfaces of lands 7a disposed on the upper surface of the PCB 7. The S-BLP 6 is then positioned on the PCB 7 so that the exposed portions of the leads 3 of the S-BLP 6 are aligned with the upper surfaces of the corresponding lands 7a. The resultant structure then undergoes a reflow process to attach the lower surfaces of the leads 3 to the PCB 7, as shown in FIG. 2.

FIG. 3 illustrates the structure of a C-BLP. As shown therein, the C-BLP includes a semiconductor chip 11, and a plurality of leads 13 attached to the upper sides of the chip 11 by an adhesive 12. Metal wires 14 electrically connect the leads 13 and a plurality of pads 11a formed on the upper center of the chip 11, and a molding section 15 encapsulates the chip 11, the metal wires 14, and the leads 13 such that the upper surfaces of the leads 13 are partially exposed.

As shown in FIG. 4, to mount the C-BLP on a printed circuit board, a solder paste 18 is applied to the upper surfaces of lands 17a formed on the upper surface of the PCB 17. Thereafter, the C-BLP 16 shown in FIG. 3 is inverted, and the leads 13 are aligned with the upper surfaces of the lands 17a. The resultant structure then undergoes a reflow process to attach the leads 13 to the PCB 17, as shown in FIG. 4.

In these types of bottom lead packages, since the exposed surfaces of the leads 3 and 13 are formed on only one side of the package, the packages cannot be stacked to increase the capacity of a package semiconductor memory device.

SUMMARY OF THE INVENTION

Accordingly, it is an object of the present invention to provide a bottom lead package which overcomes the aforementioned problem.

It is another object of the present invention to provide an improved bottom lead package which is capable of increasing a memory capacity by stacking semiconductor packages having exposed leads aligned on upper and lower surfaces of the package.

To achieve the above objects, a bottom lead package embodying the invention includes a semiconductor chip, a plurality of lower leads attached to a lower side of the chip by an adhesive, a plurality of upper leads attached to an upper side of the chip by an adhesive and connected to upper surfaces of the lower leads, metal wires electrically connecting the upper leads with a plurality of chip pads formed on the chip, and a molding section for packaging the chip, the metal wires, and the upper and lower leads such that surfaces of the upper and lower leads are externally exposed.

In an alternate embodiment, the leads could be electrically connected to bond pads on the semiconductor chip via a plurality of solder bumps. In other embodiments of the invention, upper and lower leads could be connected to one another via an electrically conductive adhesive layer.

In still other embodiments of the invention, a single set of leads may be attached to either an upper or lower side of the chip by an adhesive, or by a plurality of solder bumps that electrically connect the leads to bond pads of the chip. In this embodiment, upper and lower surfaces of the leads would extend above upper and lower surfaces of the chip. The resultant structure would then be packaged in a resin so that the upper and lower surfaces of the leads are externally exposed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
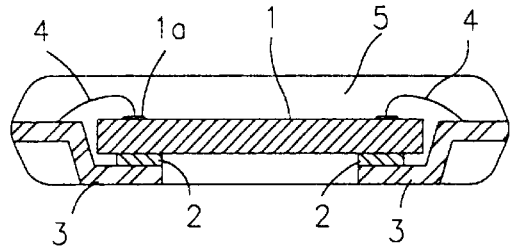
FIG. 1 is a vertical cross-sectional view illustrating a related S-BLP.
Figure 2:
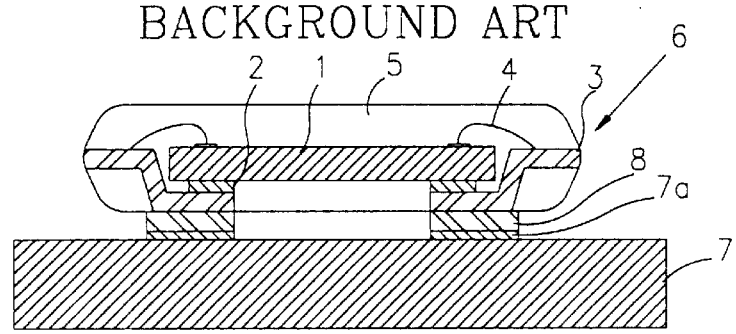
FIG. 2 is a vertical cross-sectional view illustrating the S-BLP of FIG. 1 mounted on a PCB.
Figure 3:
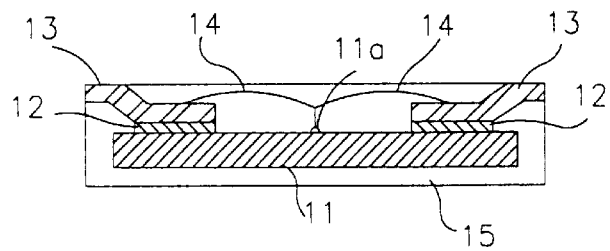
FIG. 3 is a vertical cross-sectional view illustrating a related C-BLP.
Figure 4:
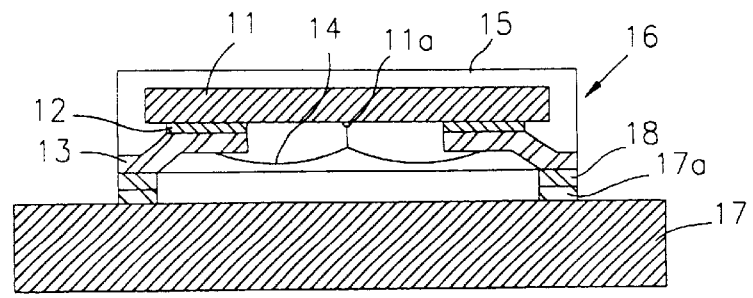
FIG. 4 is a vertical cross-sectional view illustrating the C-BLP of FIG. 3 mounted on a PCB.
Figure 5:
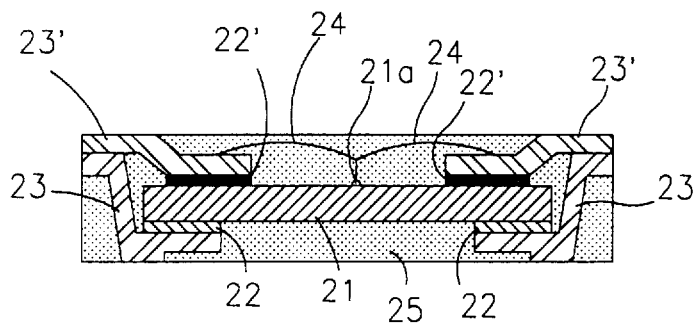
FIG. 5 is a vertical cross-sectional view illustrating a bottom lead package according to the present invention.

FIG. 5 illustrates the construction of a bottom lead package according to the present invention. As shown therein, the bottom lead package includes a semiconductor chip 21, a plurality of upwardly bent lower leads 23 attached to a lower side of the chip 21 by an adhesive 22, and a plurality of upper leads 23' attached to an upper side of the chip 21 by an adhesive 22'. The upper leads 23' are upwardly bent and they contact upper surfaces of the upwardly bent portions of the lower leads 23. Metal wires 24 are coupled to the upper leads 23' and a plurality of chip pads 21a formed on the upper surface of the chip 21. A molding section 25 packages the chip 21, the metal wires 24, and the upper and lower leads 23' and 23, such that upper and lower surfaces of the upper and lower leads 23' and 23, respectively, are externally exposed.

The metal wires 24 are formed of a material which is capable of transmitting electrical signals. Preferably, a material such as Au, having a high electrical conductivity is used. In addition, an electrically insulating adhesive is used as the adhesives 22' and 22 for attaching the upper and lower leads 23' and 23 to the chip 21.

Figure 6A:
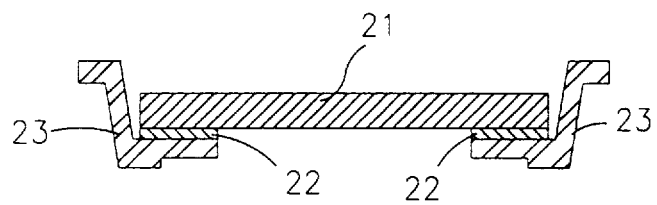
FIGS. 6A through 6C are vertical cross-sectional views illustrating a fabrication process of a bottom lead package according to the present invention and FIGS. 6D and 6E are vertical cross-sectional views of alternate embodiments of the invention.

A method of fabricating the bottom lead package according to the present invention will now be explained with reference to FIGS. 6A through 6C. As shown in FIG. 6A, in a die bonding step, a plurality of lower leads 23 are aligned at regular intervals, and the adhesive 22 is applied to the upper surfaces of the lower horizontal portions of the lower leads 23. Thereafter, the chip 21 is positioned on the insulating adhesive 22, and the chip 21 is downwardly pressed with a necessary force, so that the chip 21 is attached to the lower leads 23 by the insulating adhesive 22.

Figure 6B:
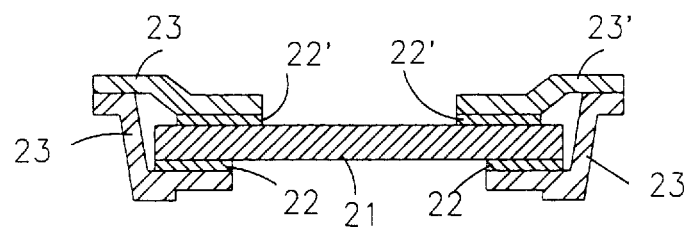

Next, as shown in FIG. 6B, in a lead junction step, an insulating adhesive 22' is applied to an upper surface of the chip 21. A plurality of upper leads 23' are then attached to the chip 21. Outer portions of the upper leads 23' are placed on the upper surfaces of corresponding lower leads 23. While the upper and lower leads 23' and 23 are being pressed together, heat is applied to join the upper and lower leads 23' and 23.

Figure 6C:
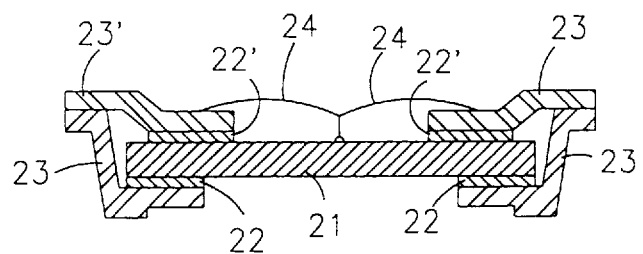

Next, as shown in FIG. 6C, a wire bonding process is performed to connect metal wires 24 between the upper surfaces of the upper leads 23' and the chip pads 21a which are aligned in the center of the chip 21.

Next, the wire-bonded chip 21 and the upper and lower leads 23' and 23 are placed in the interior of a mold. The chip 21, the metal wires 24, and the upper and lower leads 23' and 23 are then packaged by a molding process to form a molding section 25 such that surfaces of the upper and lower leads 23' and 23 are exposed, as shown in FIG. 5.

Figure 6D:
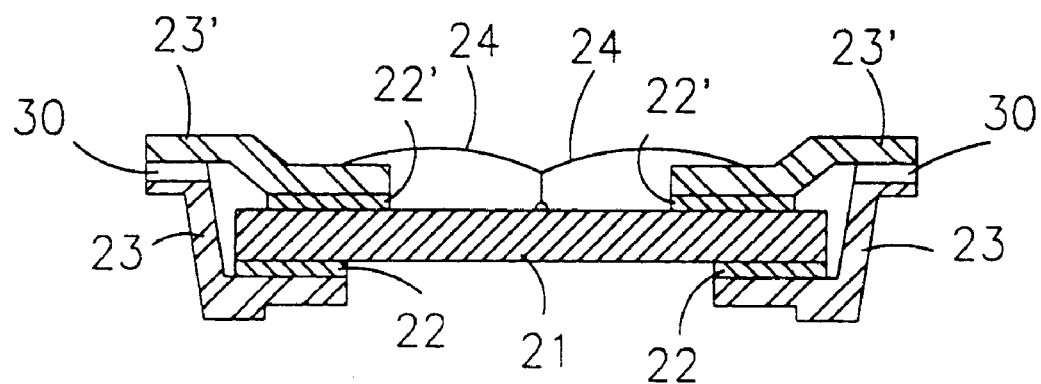
Figure 6E:
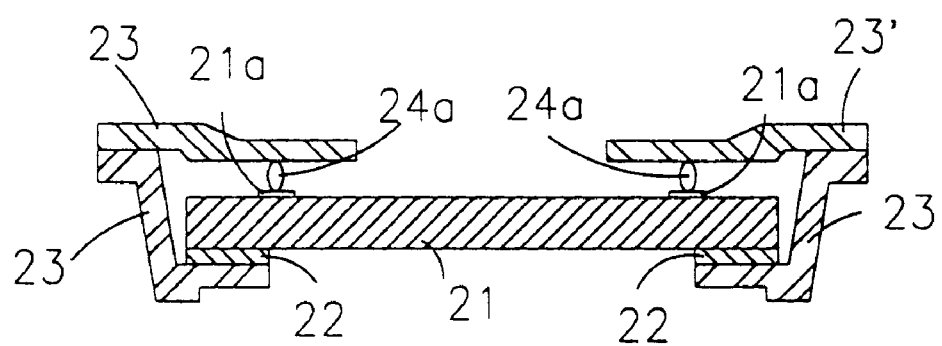

Alternate embodiments of the invention are shown in FIGS. 6D and 6E. In FIG. 6D, the upper and lower leads 23, 23' are attached to one another by an electrically conductive adhesive 30. In the embodiment shown in FIG. 6E, the upper leads 23' are attached to bond pads 21a of the chip 21 by a plurality of solder bumps or solder balls 24a.

Figure 7:
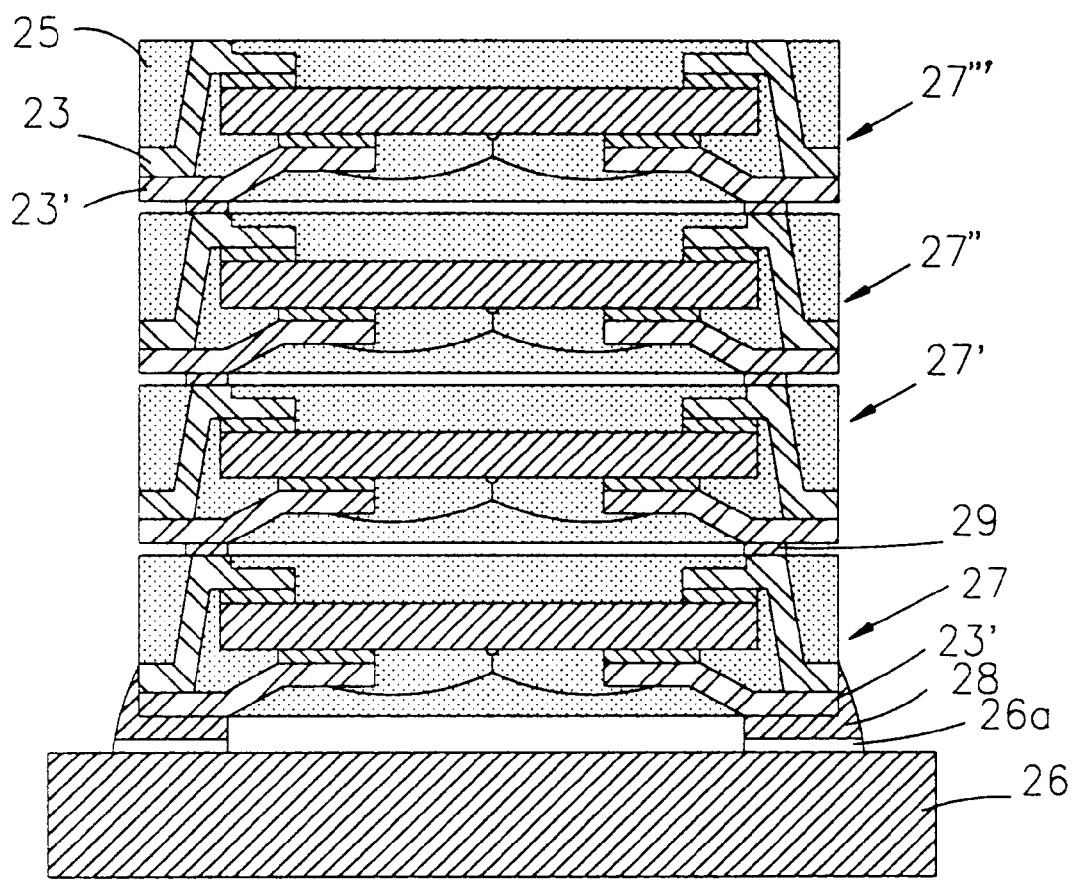
FIG. 7 is a vertical cross-sectional view illustrating a plurality of bottom lead packages according to the present invention mounted on a PCB in a stack form.

FIG. 7 shows a plurality of the bottom lead packages stacked together. To create the structure shown in FIG. 7, a solder paste 28 is first applied to the upper surfaces of lands 26a on a PCB 26 in an inverted by a screen printing process. A first package 27 is then placed on the PCB 26 such that the upper surfaces of the lands 26a are aligned with the exposed surfaces of the upper leads 23'. A reflow process is then performed to attach the first package 27 to the PCB 26. Thereafter, the surfaces of the upper leads 23' of a second inverted package 27' are aligned with the exposed surfaces of the lower leads 23 of the first inverted package 27, and then the resultant structure is soldered with a solder 29. Third and fourth packages 27" and 27'" are stacked in the same manner as described above to create the structure shown in FIG. 7. A structure as shown in FIG. 7 can have a higher memory capacity than a single related art semiconductor package mounted on the same space of a mother board.

As described above, in the bottom lead package according to the present invention, upper and lower leads are attached to the chip by adhesive, and the upper leads and the chip pads are bonded by metal wires. The chip, metal wires, and the upper and lower leads are packaged such that the upper and lower surfaces of the upper and lower leads, respectively, are externally exposed. With the above-described structure, it is possible to connect the exposed surfaces of the upper leads of one package to the exposed surfaces of the lower leads of another package, thus more easily stacking the packages and thereby increasing a memory capacity.

Figure 8A:
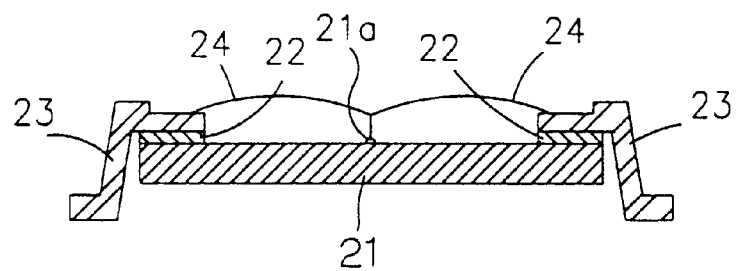
FIGS. 8A–8C are vertical cross-sectional views of additional alternate embodiments of the invention.
Figure 8B:
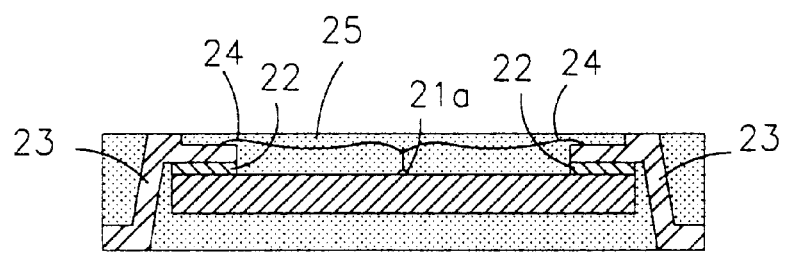
Figure 8C:
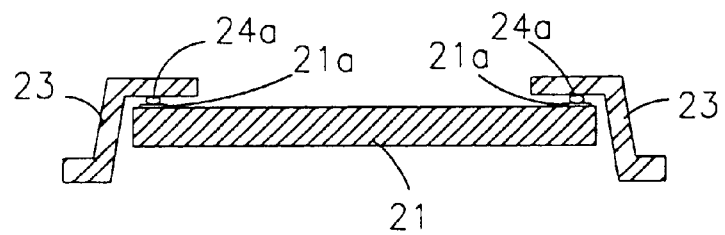

FIGS. 8A–8C illustrate additional alternate embodiments of the invention. In each of these embodiments, only a single set of leads are needed to form a device embodying the invention.

In FIG. 8A, a set of leads 23 are attached to edges of a chip 21 by an electrically insulating adhesive layer 22. Next, a wire bonding process is performed to connect bond pads 21a on the semiconductor chip 21 to corresponding ones of the leads 23 via a plurality of wires 24. This structure is then packaged with a resin 25 such that upper and lower surfaces of the leads 23 are externally exposed, as shown in FIG 8B.

In the embodiment shown in FIG. 8C, a single set of leads 23 are attached to and electrically connected to bond pads 21a of a semiconductor chip 21 via a plurality of solder bumps or solder balls 24a. The resulting structure would then be packaged with a resin 25 as shown and described above.

The foregoing embodiments are merely exemplary and are not to be construed as limiting the present invention. The present teaching can be readily applied to other types of apparatus. The description of the present invention is intended to be illustrative, and not to limit the scope of the claims. Many alternatives, modifications, and variations will be apparent to those skilled in the art.

What is claimed is:

1. A chip package, comprising:
   a chip;
   a plurality of lower leads that are attached to a lower side of the chip;
   a plurality of upper leads that are attached to an upper side of the chip and that are connected to corresponding ones of the lower leads;
   a plurality of conductive media that couple ones of the upper and lower leads with corresponding ones of a plurality of chip pads formed on the chip; and
   a molding section packaging the chip, the conductive media and the upper and lower leads such that upper and lower surfaces of the upper and lower leads, respectively, are externally exposed.

2. The package of claim 1, wherein said plurality of conductive media comprise metal wires made of Au.

3. The package of claim 1, wherein said plurality of lower leads are attached to the chip via an insulating adhesive.

4. The package of claim 1, wherein said plurality of upper leads are attached to the upper side of the chip by an insulating adhesive.

5. The package of claim 1, wherein said plurality of upper leads are attached to corresponding chip pads of the chip via the plurality of conductive media.

6. The package of claim 5, wherein the plurality of conductive media comprise one of solder bumps and solder balls.

7. The package of claim 1, wherein the plurality of upper leads are connected to respective ones of the plurality of lower leads by a conductive adhesive.

8. The chip package of claim 1, wherein corresponding ones of said plurality of lower and upper leads are rigidly attached to one another and formed to act as monolithic units.

9. A chip package, comprising:

a chip;

a plurality of leads, wherein each lead has a first portion that extends above an upper surface of the chip, a middle portion, and a second portion that extends below a bottom surface of the chip, and wherein the first portions of the leads are attached to the upper surface of the chip and the second portions of the leads are attached to a bottom surface of the chip;

a plurality of conductive media that couple ones of a plurality of chip pads on the chip to corresponding ones of the plurality of leads; and a molding section that packages the chip, the plurality of leads and the plurality of conductive media such that only surfaces of the first portions of the leads and surfaces of the second portions of the leads are externally exposed.

10. The chip package of claim 9, wherein the first portions of the leads are attached to the chip pads of the chip by the plurality of conductive media.

11. The chip package of claim 10, wherein the plurality of conductive media are one of solder balls and solder bumps.

12. The chip package of claim 9, wherein the plurality of conductive media comprise electrically conductive wires.

13. The chip package of claim 9, wherein lower surfaces of the first portions of the leads are attached to the upper surface of the chip by an insulating adhesive.

* * * * *